(12) United States Patent
Matsushita et al.

(10) Patent No.: US 9,221,980 B2
(45) Date of Patent: Dec. 29, 2015

(54) CONDUCTIVE PASTE AND PRINTED WIRING BOARD

(71) Applicant: FUJIFILM Corporation, Minato-ku, Tokyo (JP)

(72) Inventors: Yasuaki Matsushita, Kanagawa (JP); Yasuhiro Mitamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/662,421

(22) Filed: Mar. 19, 2015

(65) Prior Publication Data

US 2015/0191610 A1 Jul. 9, 2015

Related U.S. Application Data

(63) Continuation of application No. PCT/JP2013/074497, filed on Sep. 11, 2013.

(30) Foreign Application Priority Data

Sep. 27, 2012 (JP) .................. 2012-214042

(51) Int. Cl.
*H05K 1/09* (2006.01)
*C09D 5/24* (2006.01)
*H01B 1/22* (2006.01)

(52) U.S. Cl.
CPC .. *C09D 5/24* (2013.01); *H01B 1/22* (2013.01); *H05K 1/095* (2013.01); *H05K 1/097* (2013.01); *H05K 2201/0769* (2013.01)

(58) Field of Classification Search
CPC ....... H05K 1/092; H05K 1/095; H05K 3/244; H05K 1/0306
USPC ................... 174/250, 255, 256, 257
See application file for complete search history.

(56) References Cited

U.S. PATENT DOCUMENTS

| | | | | |
|---|---|---|---|---|
| 6,663,798 B2 * | 12/2003 | Sato | ............ | C03C 8/02 174/257 |
| 8,545,731 B2 * | 10/2013 | Kim | ............ | B82Y 10/00 174/250 |
| 2009/0272560 A1 * | 11/2009 | Tokunaga | ............ | H05K 3/106 174/126.1 |
| 2010/0044094 A1 * | 2/2010 | Oka | ............ | H05K 3/44 174/264 |
| 2010/0186999 A1 * | 7/2010 | Kuramoto | ............ | H01L 33/62 174/257 |
| 2010/0326706 A1 * | 12/2010 | Muro | ............ | H05K 1/0218 174/254 |
| 2011/0247863 A1 * | 10/2011 | Watanabe | ............ | H05K 1/028 174/254 |
| 2011/0247866 A1 * | 10/2011 | Kim | ............ | B82Y 30/00 174/257 |
| 2011/0278051 A1 * | 11/2011 | Himori | ............ | H05K 3/4069 174/257 |

FOREIGN PATENT DOCUMENTS

| | | | |
|---|---|---|---|
| JP | 2005-072275 A | 3/2005 |
| JP | 2010-040893 A | 2/2010 |

OTHER PUBLICATIONS

International Preliminary Report on Patentability and Written Opinion, mailed Apr. 9, 2015, issued in corresponding International Application No. PCT/JP2013/074497, 6 pages.

* cited by examiner

*Primary Examiner* — William H Mayo, III
(74) *Attorney, Agent, or Firm* — Sughrue Mion, PLLC

(57) ABSTRACT

A conductive paste which can form a silver layer and a printed wiring board having a silver layer formed of the conductive paste. The conductive paste has silver particles and a migration inhibitor, which is present in the amount of 12 parts by mass to 40 parts by mass based on 100 parts by mass of the silver particles and represented by Formula (1):

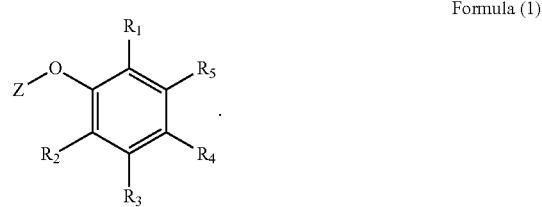

Formula (1)

11 Claims, No Drawings

US 9,221,980 B2

CONDUCTIVE PASTE AND PRINTED WIRING BOARD

CROSS-REFERENCE TO RELATED APPLICATIONS

This application is a Continuation of PCT International Application No. PCT/JP2013/074497 filed on Sep. 11, 2013, which claims priority under 35 U.S.C. §119(a) to Japanese Application No. 2012-214042 filed on Sep. 27, 2012. The above application is hereby expressly incorporated by reference, in its entirety, into the present application.

BACKGROUND OF THE INVENTION

The present invention relates to a conductive paste. Particularly, the present invention relates to a conductive paste containing a predetermined amount of migration inhibitor.

Conventionally, a wiring board in which metal wiring is disposed on the surface of an insulating substrate has been widely used in electronic components, semiconductor elements, and the like. Silver and copper are generally used to constitute the metal wiring, due to their high conductivities. However, a problem of ion migration often occurs to silver in particular.

A method of disposing a resin layer containing a migration inhibitor to cover the metal wiring has been proposed so as to prevent the ion migration of metals (JP 2005-72275 A).

SUMMARY OF THE INVENTION

Meanwhile, in recent years, with the miniaturization of semiconductor integrated circuits and chip components, the microfabrication of metal wiring has progressed. Therefore, the width and the space of the metal wiring in a wiring board have become narrower, and improvements in the insulation reliability between the silver-containing metal wiring in the wiring board is further required.

In the method described in JP 2005-72275 A, the migration inhibitor has low compatibility with resins in many cases and can hardly be dispersed uniformly in resin layer, and thus the insulation reliability has not always reached the level currently required.

In addition, at the time of selecting a resin, since it is necessary to select the resin while considering the adherence to a metal and the compatibility with the migration inhibitor, the kind of resin to be used is limited and a problem of poor versatility arose.

In view of the above circumstances, an object of the present invention is to provide a conductive paste which can form a silver layer of excellent migration resistance and conductivity in a simple manner.

The present inventors have carried out extensive studies in order to solve the problems in the prior art. They have found that using a specific migration inhibitor in a predetermined amount in a conductive paste can solve the above problems.

That is, the present inventors have found that the above problems can be solved by the following configurations.

(1) A conductive paste comprising silver particles and a migration inhibitor represented by Formula (1) described below, wherein the migration inhibitor is contained in an amount of 12 parts by mass to 40 parts by mass based on 100 parts by mass of the silver particles.

(2) The conductive paste according to (1), wherein the migration inhibitor contains at least one selected from the group consisting of a compound represented by Formula (2) described below, a compound represented by Formula (3) described below, and a compound represented by Formula (4) described below.

(3) The conductive paste according to (1) or (2), wherein the average particle diameter of the silver particles is 0.3 μm to 10 μm.

(4) The conductive paste according to any one of (1) to (3), further comprising a resin.

(5) A printed wiring board comprising a silver layer formed of the conductive paste according to any one of (1) to (4).

According to the present invention, it is possible to provide a conductive paste which can form a silver layer of excellent migration resistance and conductivity in a simple manner.

DETAILED DESCRIPTION OF THE INVENTION

Hereinafter, preferred embodiments of the conductive paste of the present invention will be described.

First, the characteristics of the present invention, compared to those of the prior art, will be described in detail.

As described above, in the conductive paste of the present invention, the migration inhibitor represented by Formula (1), which will be described later, is contained therein in a predetermined amount. If the migration inhibitor is used in a silver layer, the dispersibility thereof in the silver layer and the conductivity of the silver layer to be formed are excellent, and further, the migration inhibitor is excellent in preventing ion migration of silver.

Hereinafter, first, each of the components (silver particles, migration inhibitor represented by Formula (1), and the like) contained in the conductive paste will be described in detail.

(Silver Particles)

Silver particles are contained in the conductive paste.

The shape of the silver particles is not particularly limited, and silver particles in any shape, such as spherical, squamous, acicular or arborescent particles, can be used. In addition, the method of manufacturing the silver particles is not particularly limited, and any method, such as a mechanically grinding method, a reduction method, an electrolytic method, or a gas phase method, can be used.

The average particle size of the silver particles is not particularly limited. In the conductive paste, silver particles having a microscale average particle size (hereinafter, referred to as silver microparticles) or silver particles having a nanoscale average particle size (hereinafter, referred to as silver nanoparticles) are mainly used. Among them, silver microparticles are preferable in terms of superior conductive characteristics of the silver layer.

The average particle size of the silver microparticles is not particularly limited, but, in terms of superior conductive characteristics of the silver layer, the average particle size thereof is preferably 0.3 μm to 10 μm, and more preferably 1 μm to 5 μm.

The average particle size of the silver nanoparticles is not particularly limited, but, in terms of superior conductive characteristics of the silver layer, the average particle size thereof is preferably 5 nm to 100 nm, and more preferably 10 nm to 20 nm.

Here, the average particle size of silver particles is a mean value obtained by observing silver particles under an electron microscope (SEM or TEM) to measure the primary particle sizes (diameters) of 20 silver particles or more, and then arithmetically averaging the measured primary particle sizes. In the case in which the shape of the silver particles is not a perfect circle, an equivalent circular diameter is used.

If necessary, the surface of silver particles may be coated with a protecting agent. Coating the surface of silver particles with a protecting agent improves the storage stability of the silver particles in the conductive paste.

The kind of protecting agent to be used is not particularly limited and can be a known polymer (for example, a polymer having a functional group with free electrons at a side chain thereof, such as polyvinyl pyrrolidone), a known surfactant, or the like.

Especially, regarding silver nanoparticles, it is preferable that the surface thereof is coated with a protecting agent, and it is particularly preferable that the protecting agent to be used has a weight loss of 30% or more when heated to 160° C. in thermogravimetric analysis (TGA). With such a protecting agent, at the time of heat treatment to form a silver layer, the protecting agent hardly remains in the silver layer, and thus a silver layer of excellent conductive characteristics can be obtained.

Silver oxide may be present partially on the surface of the silver particles.

(Migration Inhibitor (Migration-preventing Agent))

The migration inhibitor represented by Formula (1) (hereinafter, also simply referred to as "the migration inhibitor") is contained in the conductive paste.

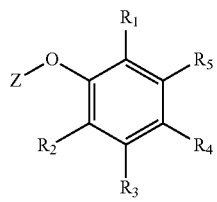

Formula (1)

In Formula (1), each of $R_1$ to $R_5$ independently represents a hydrogen atom, a hydroxyl group, an aliphatic hydrocarbon group which may have an oxygen atom, an aromatic hydrocarbon group which may have an oxygen atom, or a group composed of any combination of these. Among them, in terms of superior ion migration inhibiting ability, a hydrogen atom, an alkyl group, an alkoxy group, an aryloxy group, and a group composed of any combination of these are preferable.

The number of carbon atoms contained in the aliphatic hydrocarbon group, the aromatic hydrocarbon group, or the group composed of the combination thereof is not particularly limited, but is preferably 1 to 40, and more preferably 4 to 20, in terms of superior ion migration inhibiting ability.

The oxygen atoms may be contained in the aliphatic hydrocarbon group, the aromatic hydrocarbon group, or the like in the form of a linkage group such as —O—, —COO—, or the like.

In Formula (1), Z represents a hydrogen atom, an acyl group, or an $R_zOC(=O)$ group. $R_z$ represents an aliphatic hydrocarbon group or an aromatic hydrocarbon group. Among them, in terms of superior ion migration inhibiting ability, Z is preferably a hydrogen atom.

The number of carbon atoms contained in the acyl group or the $R_zOC(=O)$ group is not particularly limited, but is preferably 2 to 12, and more preferably 2 to 8, in terms of superior ion migration inhibiting ability.

Further, in Formula (1), the total number of carbon atoms contained in all the groups of $R_1$ to $R_5$ is 4 or more. In other words, at least one of $R_1$ to $R_5$ is a group containing carbon atoms (the aliphatic hydrocarbon group, the aromatic hydrocarbon group, or the group composed of the combination thereof described above).

If the total number of carbon atoms is within the above range, the ion migration of silver is suppressed, and thus the insulation reliability between metal wiring is improved. In terms of superior effect, the total number of carbon atoms is preferably 8 or more, and more preferably 10 or more. The upper limit of the total number of carbon atoms is not particularly limited, but, in terms of easier synthesis of the migration inhibitor and superior dispersibility thereof in the silver layer, the total number of carbon atoms is preferably 50 or less, and more preferably 40 or less.

In the migration inhibitor, when only one of $R_1$ to $R_5$ is a group containing carbon atoms (for example, the aliphatic hydrocarbon group, the aromatic hydrocarbon group, and the like), the number of carbon atoms in the group should be 4 or more.

Moreover, in the migration inhibitor, when two or more of $R_1$ to $R_5$ are groups containing carbon atoms (for example, an alkyl group, an alkoxy group, and the like), the total number of carbon atoms contained in all the groups should be 4 or more. For example, when $R_1$ and $R_2$ are alkyl groups and $R_3$ to $R_5$ are hydrogen atoms, the sum of carbon atoms contained in the alkyl group $R_1$ and the alkyl group $R_2$ should be 4 or more.

In addition, $R_1$ to $R_5$ may be bonded to each other to form a ring. In other words, any two of $R_1$ to $R_5$ may be bonded to each other to form a ring. For example, the adjacent two groups, such as $R_1$ and $R_5$, $R_2$ and $R_3$, $R_3$ and $R_4$, or $R_4$ and $R_5$, may be bonded to each other to form a ring.

The kind of the ring to be formed is not particularly limited, but, for example, can be exemplified by a 5- to 6-membered ring structure.

If necessary, $R_1$ to $R_5$ may further contain a known substituent. Examples of the substituent include a halogen atom, an alkyl group, an alkenyl group, an aryl group, a cyano group, a hydroxyl group, a nitro group, a carboxyl group, an alkoxy group, an aryloxy group, a silyloxy group, a heterocycloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, and a silyl group.

Preferred embodiments of the migration inhibitor include a compound represented by Formula (2), a compound represented by Formula (3), and a compound represented by Formula (4). These compounds contribute to superior migration resistance.

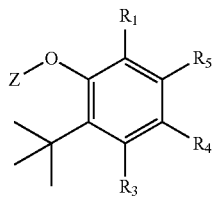

Formula (2)

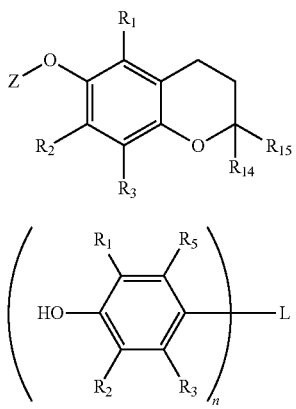

Formula (3)

Formula (4)

In Formula (2), the definition of each of $R_1$, $R_3$ to $R_5$, and Z is the same as the definition of each of the groups in Formula (1).

Here, $R_1$ and $R_3$ to $R_5$ may be bonded to each other to form a ring. In other words, any two of $R_1$ and $R_3$ to $R_5$ may be bonded to each other to form a ring. For example, the adjacent two groups, such as $R_1$ and $R_5$, $R_3$ and $R_4$, or $R_4$ and $R_5$, may be bonded to each other to form a ring.

In Formula (3), the definition of each of Z, $R_1$, $R_2$, and $R_3$ is the same as the definition of each of the groups in the Formula (1).

In the Formula (3), each of $R_{14}$ and $R_{15}$ independently represents a hydrogen atom, a hydroxyl group, an aliphatic hydrocarbon group which may contain an oxygen atom, or an aromatic hydrocarbon group which may contain an oxygen atom. Among them, in terms of superior ion migration inhibiting ability, $R_{14}$ and $R_{15}$ are preferably an alkyl group containing tertiary carbon atoms or quaternary carbon atoms.

The number of carbon atoms contained in the aliphatic hydrocarbon group or the aromatic hydrocarbon group is not particularly limited, but is preferably 1 to 40, and more preferably 2 to 20. In particular, it is preferable that $R_{14}$ is an alkyl group having 1 to 5 carbon atoms, and $R_{15}$ is an alkyl group having 10 to 20 carbon atoms.

The number of carbon atoms contained in at least one of $R_1$, $R_2$, $R_{14}$, and $R_{15}$ is 1 to 40. If the number of carbon atoms is within the above range, the dispersibility of the compound in the silver layer is improved, and the ion migration inhibiting ability thereof is also improved. The number of carbon atoms is preferably 8 to 40, and more preferably 10 to 30.

In addition, the total number of carbon atoms contained in all the groups of $R_1$, $R_2$, $R_{14}$, and $R_{15}$ is 4 or more. If the total number of carbon atoms is within the above range, the ion migration inhibiting ability is improved. In terms of superior effect, the total number of carbon atoms is preferably 8 or more, and more preferably 10 or more. The upper limit of the total number of carbon atoms is not particularly limited, but, in terms of easier synthesis of the compound and superior dispersibility thereof in the silver layer, the total number of carbon atoms is preferably 50 or less, and more preferably 40 or less.

In Formula (4), the definition of each of $R_1$ to $R_3$ and $R_5$ is the same as the definition of each of the groups in Formula (1).

L represents a divalent or trivalent aliphatic hydrocarbon group which may have an oxygen atom, a divalent or trivalent aromatic hydrocarbon group which may have an oxygen atom, or a group composed of the combination thereof.

The number of carbon atoms contained in the aliphatic hydrocarbon group or the aromatic hydrocarbon group is not particularly limited. However, the number of carbon atoms contained in the aliphatic hydrocarbon group is preferably 1 to 40 and more preferably 2 to 20, and the number of carbon atoms contained in the aromatic hydrocarbon group is preferably 6 to 40 and more preferably 6 to 20.

The aliphatic hydrocarbon group may be a linear, branched, or cyclic aliphatic hydrocarbon group.

n represents an integer of 2 or 3.

The oxygen atom may be contained in the aliphatic hydrocarbon group, the aromatic hydrocarbon group, or the like in the form of a linkage group such as —O—, —COO—, or the like.

(Other Components)

The conductive paste, if necessary, may contain other components in addition to the silver particles and the migration inhibitor.

For example, the conductive paste may contain a resin. If the conductive paste contains the resin, adherence between the substrate and the silver layer is further improved. The kind of resin to be used is not particularly limited, and is generally an insulating resin.

As the resin to be used, for example, curable resins (for example, a thermosetting resin and a photocurable resin) are preferable.

Examples of the thermosetting resin include an epoxy resin, a bismaleimide triazine resin, a polyimide resin, an acrylic resin, a phenol resin, a melamine resin, a silicone resin, an unsaturated polyester resin, a cyanate ester resin, an isocyanate resin, and modified resins of these.

Examples of the photocurable resin include an unsaturated polyester resin, a polyester acrylate resin, a urethane acrylate resin, a silicone acrylate resin, an epoxy acrylate resin, and modified resins of these.

Examples of other resins include thermoplastic resins, such as polyethylene (PE), polypropylene (PP), an ethylene-vinyl acetate copolymer (EVA), an ethylene-ethyl acrylate copolymer (EEA), polylactic acid, fluorine-containing resins, a polyether sulfone resin, a polyphenylene sulfide resin, and a poly ether ether ketone resin.

Moreover, when a curable resin is used as the resin, a curing agent, a curing accelerator, or the like may be used together with the curable resin, if necessary.

Furthermore, as the resin, a mixture of more than two kinds of resins may be used.

The conductive paste may contain a solvent. The kind of solvent to be used is not particularly limited, and can be water or an organic solvent.

Examples of the organic solvent to be used include alcohol-based solvents (for example, methanol, ethanol, isopropanol, sec-butanol, carbitol, 2-heptanol, octanol, 2-ethylhexanol, α-terpineol, and diethylene glycol monoethyl ether), ketone-based solvents (for example, acetone, methyl ethyl ketone, methyl isobutyl ketone, cyclopentanone, and cyclohexanone), aliphatic hydrocarbon-based solvents (for example, heptane, octane, and dodecane), aromatic hydrocarbon-based solvents (for example, toluene and xylene), amide-based solvents (for example, formamide, dimethylacetamide, N-methylpyrrolidone, and dimethyl propylene urea), nitrile-based solvents (for example, acetonitrile and propionitrile), ester-based solvents (for example, methyl acetate and ethyl acetate), carbonate-based solvent (for example, dimethyl carbonate and diethyl carbonate), ether-based solvents, halogen-based solvents, and the like. Two or more of these solvents may be mixed and used together.

(Conductive Paste)

The conductive paste contains the silver particles and the migration inhibitor described above.

The amount of migration inhibitor represented by Formula (1) contained in the conductive paste is 12 parts by mass to 40 parts by mass based on 100 parts by mass of the silver particles. In terms of superior migration resistance and conductivity of the obtained silver layer, the migration inhibitor content is preferably 14 parts by mass to 35 parts by mass, and more preferably 16 parts by mass to 30 parts by mass.

When the migration inhibitor content is less than 12 parts by mass, the resulting migration resistance effect is insufficient. When the migration inhibitor content is more than 40 parts by mass, conductivity and printability degrade.

The silver particle content in the conductive paste is not particularly limited. However, when the conductive paste contains a solvent, a silver layer of superior conductivity and sufficient thickness can be obtained, and an increase in viscosity of the composition is suppressed. Thus, the composition can be used as an ink composition for ink jet. Given the above, the silver particle content is preferably 5 mass % to 70 mass %, more preferably 5 mass % to 60 mass %, and still more preferably 10 mass % to 50 mass %, based on the total mass of the conductive paste.

The amount of migration inhibitor represented by Formula (1) in the conductive paste is not particularly limited as long as the aforementioned mass relationship between the migration inhibitor and the silver particles is satisfied. Nevertheless, in terms of superior migration resistance and conductivity of the obtained silver layer, the migration inhibitor content is preferably 1 mass % to 28 mass %, more preferably 5 mass % to 25 mass %, and still more preferably more than 10 mass % and 25 mass % or less, based on the total mass of the conductive paste.

When the conductive paste contains a resin, the resin content in the conductive paste is not particularly limited. However, in terms of suppressed increase in viscosity of the conductive paste and the superior ease of handling thereof, the resin content is preferably 5 mass % to 30 mass %, and more preferably 10 mass % to 20 mass %, based on the total mass of the conductive paste.

When the conductive paste contains a solvent, the solvent content in the conductive paste is not particularly limited. However, in terms of suppressed increase in viscosity of the conductive paste and superior ease of handling thereof, the solvent content is preferably 5 mass % to 90 mass %, and more preferably 15 mass % to 80 mass %, based on the total mass of the conductive paste.

When the conductive paste contains a surfactant, the surfactant content in the conductive paste is not particularly limited. However, in terms of improved coating properties of the conductive paste, the surfactant content is preferably 0.0001 mass % to 1 mass %, and more preferably 0.001 mass % to 0.1 mass %, based on the total mass of the conductive paste.

It is preferable to adjust the viscosity of the conductive paste to a level suitable for printing applications such as ink jet, screen printing, or the like. In the case of ink jet printing, the viscosity of the conductive paste is preferably 1 cP to 50 cP, and more preferably 4 cP to 40 cP. In the case of screen printing, the viscosity of the conductive paste is preferably 1000 cP to 100000 cP, and more preferably 10000 cP to 80000 cP.

The preparation of the conductive paste is not particularly limited, and can be done by any known method. For example, after adding silver particles and the migration inhibitor represented by Formula (1) to a solvent, the components are dispersed by known means such as an ultrasonic method (for example, by an ultrasonic homogenizer), a mixer method, a three-roll method, or a ball mill method, thereby producing the conductive paste.

(Silver Layer)

The silver layer can be formed by applying the above-mentioned conductive paste onto the substrate and if necessary, heating the applied conductive paste. By the above treatments, silver particles are fused to each other to form grains, and further, the grains are aggregated and fused to each other to form the silver layer. The migration inhibitor represented by Formula (1) is efficiently dispersed in the silver layer to impart ion migration resistance thereto.

The method of applying the conductive paste onto the substrate is not particularly limited, and examples thereof include known methods such as an ink jet method, a screen printing method, a gravure printing method, a gravure offset printing method, an offset printing method, and a flexo printing method.

The kind of substrate to be used is not particularly limited. For example, an organic substrate, a ceramic substrate, a glass substrate, or the like can be used. Among them, in terms of application as a printed wiring board, the substrate is preferably an insulating substrate.

The insulating substrate may be a laminated structure composed of at least two substrates selected from the group consisting of an organic substrate, a ceramic substrate, and a glass substrate.

Raw materials of the organic substrate are exemplified by resins. For example, a thermosetting resin, a thermoplastic resin, or a mixture thereof is preferably used. Examples of the thermosetting resin include a phenolic resin, a urea resin, a melamine resin, an alkyd resin, an acrylic resin, an unsaturated polyester resin, a diallyl phthalate resin, an epoxy resin, a silicone resin, a furan resin, a ketone resin, a xylene resin, a benzocyclobutene resin, and the like. Examples of the thermoplastic resin include a polyimide resin, a polyphenylene oxide resin, a polyphenylene sulfide resin, an aramid resin, a liquid crystal polymer, and the like.

In addition, as the raw material of the organic substrate, a glass woven fabric, a glass non-woven fabric, an aramid woven fabric, an aramid non-woven fabric, an aromatic polyamide woven fabric, a material of any one of these fabrics impregnated with any one of the above-mentioned resins, or the like can also be used.

When carrying out heat treatment, an optimal heating temperature is suitably selected depending on the materials used. In general, the heating temperature is preferably 100° C. to 300° C., and more preferably 100° C. to 250° C. In addition, heating time is preferably 0.2 hours to 10 hours, and more preferably 0.5 hours to 5 hours, in terms of yield of the silver layer.

The thickness of the silver layer is not particularly limited, and is optimized depending on the application of the silver layer. In terms of application as a printed wiring board, the thickness of the silver layer is preferably 0.01 μm to 1000 μm, and more preferably 0.1 μm to 100 μm.

Here, the thickness of the silver layer is a value (average value) obtained by measuring the thicknesses at any five or more points on the silver layer and calculating the arithmetic mean of the measured values.

The volume resistivity of the silver layer, in terms of conductive characteristics thereof, is preferably $1 \times 10^{-2}$ Ωcm or less, more preferably $1 \times 10^{-3}$ Ωcm or less, and still more preferably $5 \times 10^{-4}$ Ωcm or less.

The volume resistivity of the silver layer can be calculated by measuring a sheet resistance value of the silver layer by a four-point probe method and then multiplying the obtained sheet resistance by the thickness of the silver layer.

The silver layer may be provided on the entire surface of the substrate or in the form of a pattern. A patterned silver layer is useful as conductor wiring such as a printed wiring board.

Methods of obtaining the patterned silver layer can be exemplified by a method of applying the conductive paste onto the substrate in the form of a pattern and performing the above heat treatment, or a method of etching the silver layer provided on the entire surface of the substrate in the form of a pattern.

The etching method is not particularly limited, and a known subtractive method, semi-additive method, or the like may be employed.

When the patterned silver layer constitutes a multi-layered wiring board, an insulation layer (an insulating resin layer, an interlayer dielectric film, or a solder resist) is laminated on the surface of the patterned silver layer, and wiring (metal pattern) may be further formed on the surface of the insulation layer.

Known insulating materials can be used as the material of the insulation layer. Examples thereof include an epoxy resin, an aramid resin, a crystalline polyolefin resin, an amorphous polyolefin resin, a fluorine-containing resin (polytetrafluoroethylene, perfluorinated polyimide, perfluorinated amorphous resin, and the like), a polyimide resin, a polyether sulfone resin, a polyphenylene sulfide resin, a polyether ether ketone resin, an acrylate resin, and the like.

In addition, as the insulation layer, so-called optically clear adhesive (OCA) sheet may be used. Commercially available OCA products may be used, and examples thereof include 8171 CL series and 8146 CL series (manufactured by 3M Ltd), and the like.

Further, as the insulation layer, so-called solder resist layer may be used. Commercially available solder resist products may be used, and examples thereof include PFR800 and PSR4000 (trade names, manufactured by Taiyo Ink Mfg. Co., Ltd.), SR7200G (manufactured by Hitachi Chemical Co., Ltd.), and the like.

The substrate having the above-obtained silver layer (wiring board) may be used for various applications, such as printed wiring boards, TFTs, FPCs, RFIDs, and the like.

EXAMPLES

Hereinafter, the present invention will be described in more detail by Examples, but the present invention is not limited thereto.

Synthesis Example 1

Synthesis of Migration Inhibitor-free Conductive Paste A-1

2.04 g (20.0 mmol) of N,N-dimethyl-1,3-diaminopropane (Tokyo Chemical Industry Co., Ltd., special grade), 1.94 g (15.0 mmol) of n-octylamine (Kao Corporation, purity 98%), and 0.93 g (5.0 mmol) of n-dodecylamine (Kanto Chemical Co., Inc., special grade) were mixed to obtain a mixed solution, to which, 6.08 g (20.0 mmol) of silver oxalate [synthesized from silver nitrate (Kanto Chemical Co., Inc., first grade) and ammonium oxalate monohydrate or oxalic acid dihydrate (Kanto Chemical Co., Inc., special grade)] was added, and the mixed solution was stirred for 3 minutes to form an oxalate ion-alkylamine-alkyldiamine-silver complex compound. After heating and stirring the complex compound at 95° C. for 20 to 30 minutes, it converted to a suspension exhibiting a blue luster as a reaction accompanied by carbon dioxide bubbling completed. 10 mL of methanol (Kanto Chemical Co., Inc., first grade) was added to the suspension, which was centrifuged to obtain a precipitate, and then the precipitate was naturally dried to yield 4.62 g (silver-based yield 97.0%) of a lustrous blue solid of coated silver ultrafine particles. 4.62 g of the solid was dispersed in a mixed solvent of n-butanol (Kanto Chemical Co., Inc., special grade) and n-octane (Kanto Chemical Co., Inc., special grade) (4/1: v/v) to produce a migration inhibitor-free conductive paste A-1.

Synthesis Example 2

Synthesis of Migration Inhibitor-containing Conductive Paste B-1

To the conductive paste A-1 (11.55 g) obtained in Synthesis Example 1, 0.87 g of DL-α-tocopherol (manufactured by Tokyo Chemical Industry Co., Ltd.) was added and the mixture was stirred to obtain a migration inhibitor-containing conductive paste B-1.

Synthesis Example 3

Synthesis of Migration Inhibitor-containing Conductive Paste B-2

To the conductive paste A-1 (11.55 g) obtained in Synthesis Example 1, 0.87 g of IRGANOX 245 (manufactured by BASF Corporation) was added and the mixture was stirred to obtain a migration inhibitor-containing conductive paste B-2.

<Migration Inhibitor-free Conductive Paste A-2>

As migration inhibitor-free conductive paste A-2, a polymer-type conductive paste LS-450-7H (manufactured by Asahi Chemical Research Laboratory Co., Ltd.) was used.

Synthesis Example 4

Synthesis of Migration Inhibitor-containing Conductive Paste B-3

To the above-mentioned conductive paste A-2 (10 g), 1.05 g of DL-α-tocopherol (manufactured by Tokyo Chemical Industry Co., Ltd.) was added and the mixture was stirred to obtain a migration inhibitor-containing conductive paste B-3.

Synthesis Example 5

Synthesis of Migration Inhibitor-containing Conductive Paste B-4

To the above-mentioned conductive paste A-2 (10 g), 1.75 g of DL-α-tocopherol (manufactured by Tokyo Chemical Industry Co., Ltd.) was added and the mixture was stirred to obtain a migration inhibitor-containing conductive paste B-4.

<Migration Inhibitor-free Conductive Paste A-3>

As migration inhibitor-free conductive paste A-3, nanopaste NPS (manufactured by Harima Chemicals Group, Inc.) was used.

Synthesis Example 6

Synthesis of Migration Inhibitor-containing Conductive Paste B-5

To the above-mentioned conductive paste A-3 (10 g), 1.04 g of DL-α-tocopherol (manufactured by Tokyo Chemical Industry Co., Ltd.) was added and the mixture was stirred to obtain a migration inhibitor-containing conductive paste B-5.

Synthesis Example 7

Synthesis of Migration Inhibitor-containing Conductive Paste B-6

To the conductive paste A-1 (11.55 g) obtained in Synthesis Example 1, 0.21 g of DL-α-tocopherol (manufactured by Tokyo Chemical Industry Co., Ltd.) was added and the mixture was stirred to obtain a migration inhibitor-containing conductive paste B-6.

Synthesis Example 8

Synthesis of Migration Inhibitor-containing Conductive Paste B-7

To the above-mentioned conductive paste A-2 (10 g), 0.35 g of IRGANOX 245 (manufactured by BASF Corporation) was added and the mixture was stirred to obtain a migration inhibitor-containing conductive paste B-7.

Synthesis Example 9

Synthesis of Migration Inhibitor-containing Conductive Paste B-8

To the above-mentioned conductive paste A-2 (10 g), 3.5 g of IRGANOX 245 (manufactured by BASF Corporation) was added and the mixture was stirred to obtain a migration inhibitor-containing conductive paste B-8.

Synthesis Example 10

Synthesis of Migration Inhibitor-containing Conductive Paste B-9

To the above-mentioned conductive paste A-2 (10 g), 0.7 g of phenothiazine (manufactured by Tokyo Chemical Industry Co., Ltd.) was added and the mixture was stirred to obtain a migration inhibitor-containing conductive paste B-9.

Examples 1 and 2 and Comparative Example 1

Wiring Formation by Ink Jet

Using a DMP-2831 material printer (manufactured by FUJIFILM Dimatix Co., Ltd.) under the conditions of a drop size of 10 μL and a drop spacing of 50 μm, each of the conductive pastes was deposited onto a glass substrate to form a comb-shaped (L/S=75/75 μm) pattern in two repeated steps to get a desired thickness. Thereafter, the substrate was baked in an oven at 230° C. for 1 hour to prepare a test wiring board having a silver layer.

Each of the above conductive pastes was used in one of the Examples and Comparative Examples, as described in Table 1 below. Further, this method is denoted by "IJ" in the "wiring forming method" column of Table 1.

Examples 3 to 5 and Comparative Examples 2 to 4

Wiring Formation by Screen Printing

Using a DP-320 type screen printing machine (manufactured by Newlong Seimitsu Kogyo Co., Ltd.), each of the conductive pastes was deposited onto a glass substrate to form a comb-shaped (L/S=75/75 μm) pattern (a 420 mesh screen was used). Thereafter, the substrate was baked in an oven at 230° C. for 1 hour to prepare a test wiring board having a silver layer.

Each of the conductive pastes was used in one of the Examples and Comparative Examples, as described in Table 1 below. Further, this method is denoted by "screen" in the "wiring forming method" column of Table 1.

<Measurement Method of Silver Layer Thickness>

The prepared test wiring board was embedded in epoxy resin, and then polished until its cross section was exposed. Thereafter, the exposed section was observed and the thickness of the silver layer was measured using S-3000N (SEM manufactured by Hitachi Ltd.). The results thereof are summarized in Table 1.

Here, the thickness of the silver layer was obtained by measuring the thicknesses of any five points on the silver layer and calculating the arithmetic mean of the measured values.

<Conductivity Evaluation Method>

The conductivity of the obtained test wiring board was evaluated using the resistivity meter Loresta EP MCP-T360 (manufactured by Mitsubishi Chemical Analytech Co., Ltd.).

In the evaluation method, the measured resistivity value of the silver layer of the prepared test wiring board was set to R1, the measured resistivity value of the silver layer of the comparative wiring board prepared by only using the migration inhibitor-free conductive paste A (replacing the portion in which the conductive paste B is used) was set to R2, and the change rate thereof R1/R2 was calculated. The evaluation was performed according to the below criteria. The results thereof are summarized in Table 1. A wiring board rated C or higher (B and A) is usable, and a wiring board rated B or higher (A) is preferable.

A: R1/R2≤1.1
B: 1.1<R1/R2≤1.25
C: 1.25<R1/R2≤2.0
D: 2.0<R1/R2

Here, in Examples 1 and 2 and Comparative Example 1, the evaluation was performed on the comparative wiring boards in which the conductive paste A-1 was used as the conductive paste A.

In Examples 3 and 4 and Comparative Examples 2 to 4, the evaluation was performed on the comparative wiring boards in which the conductive paste A-2 was used as the conductive paste A.

In Example 5, the evaluation was performed on the comparative wiring board in which the conductive paste A-3 was used as the conductive paste A.

<Insulation Reliability Evaluation Method>

Lifetime of the test wiring board was measured under the conditions of a humidity of 85%, a temperature of 85° C., a pressure of 1.0 atm, and a voltage of 80 V (measurement equipment: EHS-221MD, manufactured by ESPEC Corporation).

In the evaluation method, first, a wiring board for insulation reliability test was prepared by attaching high transparent adhesive transfer tape 8146-2 (manufactured by 3M Corporation) onto the surface of the silver layer side of the test wiring board, and attaching a glass substrate to the opposite side of the tape. Then, the test wiring board's lifetime, a time period T1 until the resistance value between the silver layer traces becomes $1 \times 10^5 \Omega$, was measured under the above conditions.

Next, another insulation reliability test board was prepared in the above-mentioned manner using the comparative wiring board prepared by only using the migration inhibitor-free conductive paste A (replacing the portion in which the conductive paste B is used with the conductive paste A). The comparative wiring board's lifetime, a time period T2 until the resistance value between the silver layer traces becomes $1 \times 10^5 \Omega$, was measured under the above conditions.

A lifetime improvement effect (T1/T2) was calculated using the time T1 and the time T2 obtained. The evaluation was based on the following criteria. The results thereof are summarized in Table 1. A wiring board rated C or higher (B and A) is usable, and a wiring board rated B or higher (A) is preferable.

A: T1/T2≥5
B: 5>T1/T2≥2
C: 2>T1/T2>1
D: 1≥T1/T2

Here, in Examples 1 and 2 and Comparative Example 1, the evaluation was performed on the comparative wiring boards in which the conductive paste A-1 was used as the conductive paste A.

In Examples 3 and 4 and Comparative Examples 2 to 4, the evaluation was performed on the comparative wiring boards in which the conductive paste A-2 was used as the conductive paste A.

In Example 5, the evaluation was performed on the comparative wiring board in which the conductive paste A-3 was used as the conductive paste A.

TABLE 1

|  | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|
| Conductive paste | B-1 | B-2 | B-3 | B-4 | B-5 | B-6 | B-7 | B-8 | B-9 |
| Amount of migration inhibitor added to silver particles (parts by mass) | 15 | 15 | 15 | 25 | 14 | 4 | 5 | 50 | 10 |
| Wiring forming method | IJ | IJ | screen | screen | screen | IJ | screen | screen | screen |
| Thickness of silver layer (μm) | 2.6 | 2.4 | 4.2 | 4.4 | 4.7 | 2.6 | 4.1 | 4.8 | 4.2 |
| Conductivity evaluation | B | A | B | B | B | A | A | D | B |
| Insulation reliability evaluation | A | A | A | A | A | D | D | B | D |

As shown in Table 1 above, in the wiring boards made with the conductive pastes of the present invention, the conductivity of the silver layer was excellent, and the insulation reliability between the silver layers was also excellent.

In contrast, in Comparative Examples 1 to 3 in which the conductive paste used contains migration inhibitor out of the predetermined range, and in Comparative Example 4 in which components other than the specific migration inhibitor were used, either conductivity or insulation reliability was degraded.

What is claimed is:

1. A conductive paste, comprising:
   silver particles; and
   a migration inhibitor represented by Formula (1),
   wherein the migration inhibitor is contained in an amount of 12 parts by mass to 40 parts by mass based on 100 parts by mass of the silver particles:

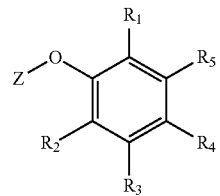

Formula (1)

(in Formula (1), each of $R_1$ to $R_5$ independently represents a hydrogen atom, a hydroxyl group, an aliphatic hydrocarbon group which may have an oxygen atom, an aromatic hydrocarbon group which may have an oxygen atom, or a group composed of any combination of these; Z represents a hydrogen atom, an acyl group, or an $R_zOC(=O)$ group; $R_z$ represents an aliphatic hydrocarbon group or an aromatic hydrocarbon group; the total number of carbon atoms contained in all the groups of $R_1$ to $R_5$ is 4 or more; and $R_1$ to $R_5$ may be bonded to each other to form a ring).

2. The conductive paste according to claim 1, wherein the migration inhibitor contains at least one selected from the group consisting of a compound represented by Formula (2), a compound represented by Formula (3), and a compound represented by Formula (4):

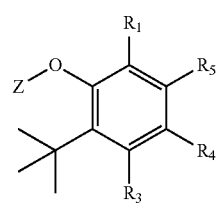

Formula (2)

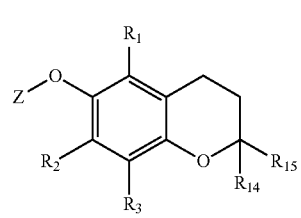

Formula (3)

Formula (4)

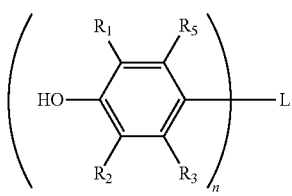

(in Formula (2), each of $R_1$ and $R_3$ to $R_5$ independently represents a hydrogen atom, a hydroxyl group, an aliphatic hydrocarbon group which may have an oxygen atom, an aromatic hydrocarbon group which may have an oxygen atom, or a group composed of any combination of these; Z represents a hydrogen atom, an acyl group, or an $R_zOC(=O)$ group; $R_z$ represents an aliphatic hydrocarbon group or an aromatic hydrocarbon group; and $R_1$ and $R_3$ to $R_5$ may be bonded to each other to form a ring, in Formula (3), each of $R_1$ to $R_3$, $R_{14}$, and $R_{15}$ independently represents a hydrogen atom, a hydroxyl group, an aliphatic hydrocarbon group which may contain an oxygen atom, or an aromatic hydrocarbon group which may contain an oxygen atom; Z represents a hydrogen atom, an acyl group, or an $R_zOC(=O)$ group; $R_z$ represents an aliphatic hydrocarbon group or an aromatic hydrocarbon group; the number of carbon atoms contained in at least one of $R_1$, $R_2$, $R_{14}$, and $R_{15}$ is 1 to 40; and the total number of carbon atoms contained in all the groups of $R_1$, $R_2$, $R_{14}$, and $R_{15}$ is 4 or more, and in Formula (4), each of $R_1$ to $R_3$ and $R_5$ independently represents a hydrogen atom, a hydroxyl group, an aliphatic hydrocarbon group which may have an oxygen atom, an aromatic hydrocarbon group which may have an oxygen atom, or a group composed of any combination of these; and L represents a divalent or trivalent aliphatic hydrocarbon group which may have an oxygen atom, a divalent or trivalent aromatic hydrocarbon group which may have an oxygen atom, or a group composed of the combination thereof).

3. The conductive paste according to claim 2, wherein the average particle diameter of the silver particles is 0.3 μm to 10 μm.

4. The conductive paste according to claim 2, further comprising a resin.

5. A printed wiring board comprising a silver layer formed of the conductive paste according to claim 2.

6. The conductive paste according to claim 1, wherein the average particle diameter of the silver particles is 0.3 μm to 10 μm.

7. The conductive paste according to claim 6, further comprising a resin.

8. A printed wiring board comprising a silver layer formed of the conductive paste according to claim 6.

9. The conductive paste according to claim 1, further comprising a resin.

10. A printed wiring board comprising a silver layer formed of the conductive paste according to claim 9.

11. A printed wiring board comprising a silver layer formed of the conductive paste according to claim 1.

* * * * *